United States Patent
Aga et al.

(10) Patent No.: US 6,372,609 B1
(45) Date of Patent: Apr. 16, 2002

(54) METHOD OF FABRICATING SOI WAFER BY HYDROGEN ION DELAMINATION METHOD AND SOI WAFER FABRICATED BY THE METHOD

(75) Inventors: Hiroji Aga; Naoto Tate; Kiyoshi Mitani, all of Annaka (JP)

(73) Assignees: Shin-Etsu Handotai Co., Ltd., Tokyo (JP); Soitec S.A., Bernin (FR)

(*) Notice: Subject to any disclaimer, the term of this patent is extended or adjusted under 35 U.S.C. 154(b) by 0 days.

(21) Appl. No.: 09/555,687
(22) PCT Filed: Oct. 8, 1999
(86) PCT No.: PCT/JP99/05588
  § 371 Date: Jun. 2, 2000
  § 102(e) Date: Jun. 2, 2000
(87) PCT Pub. No.: WO00/24059
  PCT Pub. Date: Apr. 27, 2000

(30) Foreign Application Priority Data

Oct. 16, 1998 (JP) .............................. 10-314018

(51) Int. Cl.$^7$ ............................................. H01L 21/30
(52) U.S. Cl. ..................... 438/459; 438/455; 438/456; 438/457
(58) Field of Search ................... 438/455, 456, 438/457, 458, 459

(56) References Cited

U.S. PATENT DOCUMENTS 5,374,581 A * 12/1994 Ichikawa et al. ............ 438/459
5,670,411 A * 9/1997 Yonehara et al. ............ 438/459
6,100,166 A * 8/2000 Sakaguchi et al. .......... 438/455
6,121,117 A * 9/2000 Sato et al. .................. 438/459

FOREIGN PATENT DOCUMENTS

| JP | A-3-109731 | 5/1991 |
| JP | A-4-115511 | 4/1992 |
| JP | A-7-183477 | 7/1995 |
| JP | A-9-260620 | 10/1997 |
| JP | A-10-200080 | 7/1998 |
| JP | A-10-275905 | 10/1998 |

* cited by examiner

Primary Examiner—David Nelms
Assistant Examiner—Dung A Le
(74) Attorney, Agent, or Firm—Oliff & Berridge, PLC

(57) ABSTRACT

There is provided a method of fabricating an SOI wafer having high quality by hydrogen ion delamination method wherein a damage layer remaining on the surface of the SOI layer after delamination and surface roughness are removed maintaining thickness uniformity of the SOI layer. According to the present invention, there are provided a method of fabricating an SOI wafer by hydrogen ion delamination method wherein an oxide film is formed on an SOI layer by heat treatment in an oxidizing atmosphere after bonding heat treatment, then the oxide film is removed, and subsequently heat treatment in a reducing atmosphere is performed; a method of fabricating an SOI wafer by hydrogen ion delamination method wherein an oxide film is formed on an SOI layer by heat treatment in an oxidizing atmosphere after delaminating heat treatment, then the oxide film is removed, and subsequently heat treatment in a reducing atmosphere is performed; and an SOI wafer fabricated by the methods.

16 Claims, 3 Drawing Sheets

METHOD OF FABRICATING SOI WAFER BY HYDROGEN ION DELAMINATION METHOD AND SOI WAFER FABRICATED BY THE METHOD

TECHNICAL FIELD

The present invention relates to a method of removing a damage layer remaining on an SOI (silicon on insulator) layer after delamination and surface roughness, and simplifying processes in so-called hydrogen ion delamination method (also called smart-cut method) wherein an ion-implanted wafer is bonded to another wafer and then a portion of the ion-implanted wafer is delaminated to provide an SOI wafer.

BACKGROUND ART

Recently, public attention has been newly drawn to a method of fabricating an SOI wafer in which an ion-implanted wafer is bonded to another wafer and then a portion of the ion-implanted wafer is delaminated to provide an SOI wafer (hydrogen ion delamination method: so-called smart-cut method). In this method, an oxide film is formed on at least one of two silicon wafers; hydrogen ions or rare gas ions are implanted into the upper surface of one of the wafers in order to form a fine bubble layer (enclosed layer) within the wafer; the ion-implanted silicon wafer is superposed on the other silicon wafer such that the ion-implanted surface comes into close contact with the other silicon wafer via the oxide film; heat treatment (delaminating heat treatment) is then performed to delaminate a portion of one of the wafers using the fine bubble layer as a delaminating plane, in order to form a thin film; and heat treatment (bonding heat treatment) is further performed to firmly bond them, to provide an SOI wafer (see Japanese Patent Application Laid-Open (Kokai) No. 5-211128). According to this method, since a split surface (a delaminated surface) is a good mirror-like surface, and an SOI wafer whose SOI layer has a high thickness uniformity can be obtained relatively easily.

However, when the SOI wafer is fabricated according to the hydrogen ion delamination method, there exists a damage layer due to ion implantation on the surface of the SOI wafer after delamination, and surface roughness of the resultant SOI wafer is large compared with a mirror surface of a general silicon wafer. Accordingly, it is necessary to remove such a damage layer and surface roughness in the hydrogen ion delamination method. Conventionally, in order to remove a damage layer or the like there has been performed as the final step after bonding heat treatment a mirror polishing process, called "touch polishing", wherein a stock removal is very small.

However, when the SOI layer is polished by means of mechanical machining, thickness uniformity of the SOI layer achieved by hydrogen ion implantation and delamination is degraded, since the stock removal is not uniform. Moreover, if mirror polishing is conducted after bonding heat treatment, it involves many and complicated processes and causes disadvantage in cost.

There has been thus proposed a method of removing a damage layer, by so-called sacrificial oxidation wherein an oxide film on an SOI layer by subjecting the SOI layer after delamination to heat treatment in an oxidizing atmosphere and then removing the oxide film. According to the method, a damage layer can be removed without performing polishing by means of mechanical machining.

However, surface roughness of the SOI layer cannot be sufficiently improved only with the above-mentioned sacrificial oxidation. Accordingly, it is still necessary to perform touch polishing which is mechanical polishing in order to improve surface roughness, which may lead to degradation of thickness uniformity of the SOI layer. Furthermore, when heat treatment is performed in an oxidizing atmosphere, OSFs (oxidation induced stacking faults) are sometimes generated due to damage on the surface of the SOI layer.

There has been thus proposed a method for removing a damage on the SOI layer and improving surface roughness by performing heat treatment in a reducing atmosphere without polishing the surface of the SOI wafer obtained by the hydrogen ion delamination method. According to the method, the damage remaining on the SOI layer after delamination and surface roughness of the surface of the SOI layer can be improved, with maintaining thickness uniformity.

However, damage in the SOI layer of the SOI wafer obtained by hydrogen ion delamination method is large in a surface part, and gets smaller at the inner part of the layer. When heat treatment in a reducing atmosphere is performed as described above, removal of damage will progress from the inner part to the surface part of the SOI layer. However, if the damage in a surface part is large, heat treatment at high temperature for a long time will be necessary, and in some cases, damage is not removed completely even when heat treatment is performed at high temperature for a long time.

Size and depth of the damage depend on the degree of implantation energy and a dose amount of hydrogen ion implantation. Accordingly, such a problem is serious especially, for example, in the case that large implantation energy is required for producing an SOI wafer having a thick SOI layer or a thick buried oxide layer, or in that case that it is necessary to increase a doze amount for the purpose of performing delaminating heat treatment at a low temperature.

When heat treatment in a reducing atmosphere such as hydrogen atmosphere or the like is performed at high temperature for a long time, silicon on the surface of the SOI layer is etched, so that thickness uniformity is degraded, and etch pits are sometimes generated in the buried oxide layer. These problems are caused, when the SOI layer includes defects such as COPs (Crystal Originated Particle) that extend to the oxide film thereunder. Because, the COPs are not eliminated but remain, or sometimes enlarged, and therefore the buried oxide layer may also be etched by hydrogen or the like getting therein through the defects, and pits are formed there. The etch pits cause a problem that the SOI layer near them are affected by them.

As described above, there have been proposed various methods in order to remove a damage layer and surface roughness of an SOI wafer obtained by hydrogen ion delamination method maintaining thickness uniformity of an SOI layer. However, they are not satisfactory, and appropriate methods for solving the problems have been required.

DISCLOSURE OF THE INVENTION

The present invention has been accomplished to solve the above-mentioned problems. An object of the present invention is to provide a method of fabricating a high quality SOI wafer by hydrogen ion delamination method wherein a damage layer remaining on the surface of the SOI layer after delamination and surface roughness are removed maintaining thickness uniformity of the SOI layer, and to improve productivity in manufacture of wafer.

To achieve the above mentioned object, the present invention provides a method of fabricating an SOI wafer by hydrogen ion delamination method wherein an oxide film is formed on an SOI layer by heat treatment in an oxidizing atmosphere after bonding heat treatment, then the oxide film is removed, and subsequently heat treatment is performed in a reducing atmosphere.

When the SOI layer is subjected to sacrificial oxidation wherein the oxide film is formed on the SOI layer by heat treatment in an oxidizing atmosphere after bonding heat treatment and then the oxide film is removed as described above, all or a part of a damage layer on the surface of the SOI layer is incorporated into the oxide film. Accordingly, when the oxide film is removed, the damage layer can be efficiently removed. And, when it is subsequently subjected to heat treatment in a reducing atmosphere, the damage layer remaining on the SOI layer can be recovered, and surface roughness can be improved. In that case, since all or a part of the damage layer on the SOI layer has already been removed, heat treatment time can be short, so that the SOI layer or a buried oxide layer can be prevented from being etched. Moreover, the method does not require mechanical polishing, and thus thickness uniformity of the SOI layer is not degraded. As a result, an SOI wafer having extremely high quality can be fabricated by the hydrogen ion delamination method in higher productivity.

The present invention also provides a method of fabricating an SOI wafer by hydrogen ion delamination method wherein an oxide film is formed on an SOI layer by heat treatment in an oxidizing atmosphere after delaminating heat treatment, then the oxide film is removed, and subsequently heat treatment is performed in a reducing atmosphere.

According to this method, the oxide film is formed on the SOI layer by heat treatment in an oxidizing atmosphere after delaminating heat treatment and then the oxide film is removed as described above, and therefore, all or a part of a damage layer on the surface of the SOI layer is incorporated into the oxide film. Accordingly, when the oxide film is removed, the damage layer can be efficiently removed. And, when it is subjected to heat treatment in a reducing atmosphere, the damage layer remaining on the SOI layer can be recovered, and surface roughness can be improved. In that case, since all or a part of the damage layer on the SOI layer has already been removed, heat treatment can be performed in short time and effectively, so that the SOI layer or a buried oxide layer can be prevented from being etched. Moreover, the method does not require polishing that is mechanical machining, and thus thickness uniformity of the SOI layer is not degraded.

In the above method, if bonding heat treatment is performed after the oxide film is formed, the oxide film can function also as a surface protecting film during the bonding heat treatment. Thus, the surface of the SOI layer can be prevented from being etched, differently from the case that the bonding heat treatment is performed in non-oxidizing atmosphere. Alternatively, heat treatment in an oxidizing atmosphere or a heat treatment in the reducing atmosphere can also function as bonding heat treatment. In that case, it is not necessary to perform bonding heat treatment independently, so that the SOI wafer having extremely high quality can be fabricated by hydrogen ion delamination method in more simple processes and in high productivity.

In that case, the above-mentioned heat treatment in a reducing atmosphere is preferably performed at a temperature in the range from 1000° C. to 1300° C. for 1 to 60 seconds through use of a rapid heating/rapid cooling apparatus.

When heat treatment in a reducing atmosphere is performed at a high temperature in the range from 1000° C. to 1300° C. for a short time of 1 to 60 seconds through use of a rapid heating/rapid cooling apparatus as described above, a damage layer on the surface of the SOI wafer and surface roughness can be efficiently improved in an extremely short time. Furthermore, the SOI layer or the buried oxide layer can be prevented from being etched.

The above-mentioned heat treatment in a reducing atmosphere is preferably performed in 100% hydrogen atmosphere or a mixed atmosphere of hydrogen and argon.

If heat treatment is performed in such an atmosphere, a damage layer on the surface of the SOI layer and the surface roughness can be surely improved.

Thickness of the oxide film on the SOI layer formed by the above-mentioned heat treatment in an oxidizing atmosphere can be twice or more the thickness of the damage layer existing on the surface of the SOI layer before the oxide film is formed.

As described above, when the thickness of the oxide film formed on the SOI layer by heat treatment in an oxidizing atmosphere is twice or more the thickness of the damage layer existing on the surface of the SOI layer before the oxide film is formed, almost all of the damage layer can be incorporated into the formed oxide film, so that heat treatment time to be performed later in a reducing atmosphere can be shorter. Accordingly, the damage layer or the like can be removed efficiently.

Moreover, temperature for the above-mentioned heat treatment in an oxidizing atmosphere is preferably lower than temperature for the above-mentioned heat treatment in an reducing atmosphere for the following reason.

OSFs are sometimes generated due to the damage on the surface of the SOI layer while heat treatment in an oxidizing atmosphere is performed. If heat treatment in a reducing atmosphere is performed at a higher temperature than temperature for heat treatment in an oxidizing atmosphere, the OSFs generated on the surface of the SOI layer can be easily removed.

The above-mentioned heat treatment in an oxidizing atmosphere is preferably performed at a temperature of 1000° C. or lower.

As described above, if heat treatment in an oxidizing atmosphere is performed at a temperature of 1000° C. or lower, generation of OSFs on the SOI layer can be prevented.

The SOI wafer fabricated according to the method of the present invention has no damage layer on the SOI layer, and has improved surface roughness, good thickness uniformity and excellent quality.

As described above, according to the present invention, a damage layer remaining on the surface of the SOI layer and surface roughness can be removed efficiently, maintaining thickness uniformity of the SOI layer by performing a combination of sacrificial oxidation and heat treatment in a reducing atmosphere after delamination in a hydrogen ion delamination method. Accordingly, SOI wafer having extremely high quality can be produced in high productivity.

BEST MODE FOR CARRYING OUT THE INVENTION

Figure 1:
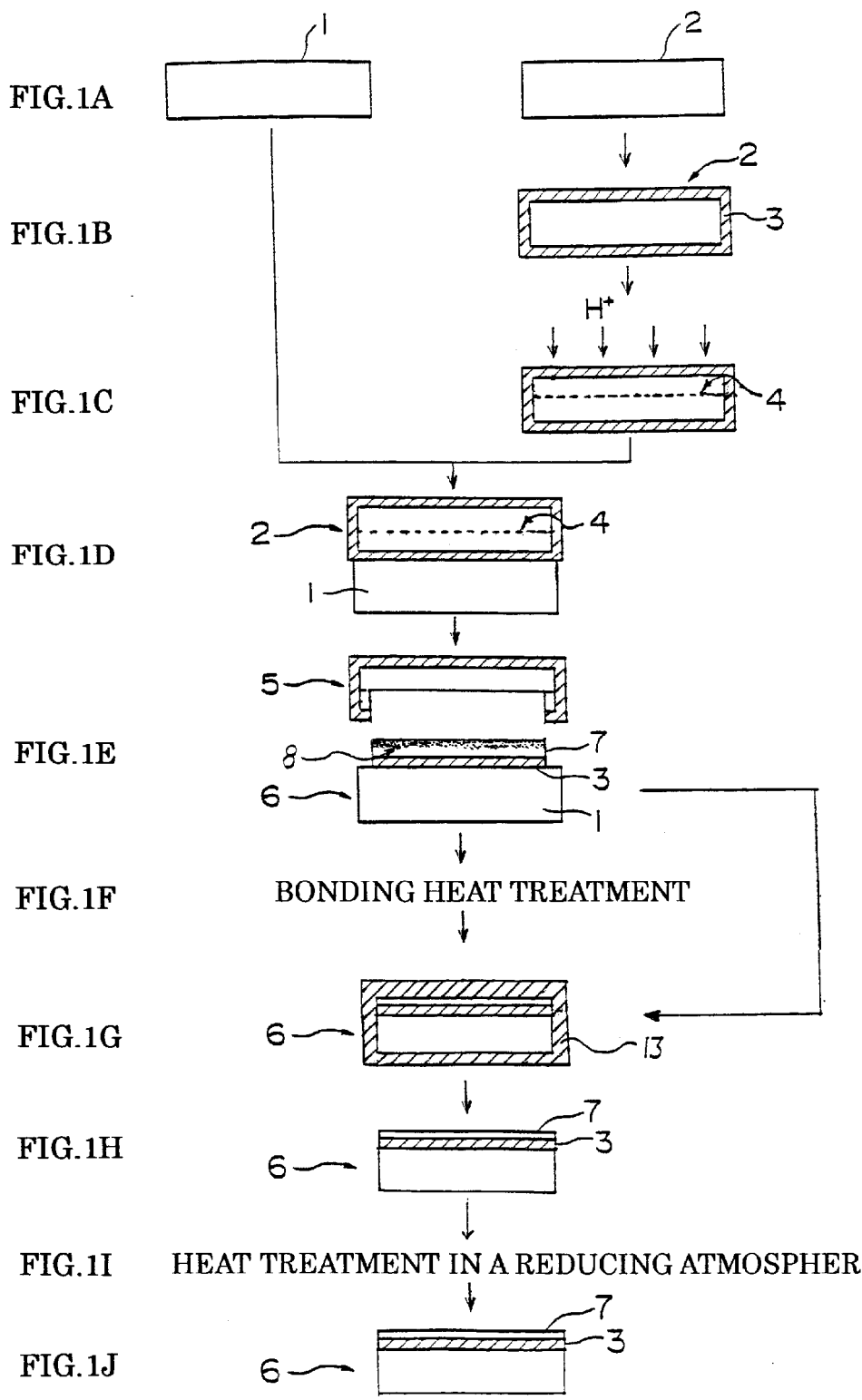
FIG. 1A–J is a flowchart showing an example of an SOI-wafer fabricating process according to the hydrogen ion delamination method of the present invention.

The present invention will be further described below in detail, but is not limited thereto.

The inventors have found that a damage layer and surface roughness of the SOI layer can be removed maintaining thickness uniformity of the SOI layer by performing a combination of sacrificial oxidation and heat treatment in a reducing atmosphere after bonding heat treatment or after delamination heat treatment in the method of fabricating SOI wafer according to the hydrogen ion delamination method, and have studied further each of conditions to complete the present invention.

Namely, according to the conventional method wherein only sacrificial oxidation is performed, the damage layer in the SOI layer can be removed, but surface roughness cannot be improved sufficiently. As a result, it is necessary to perform polishing or the like that degrades thickness uniformity of the SOI layer.

On the other hand, according to the method wherein only heat treatment in a reducing atmosphere is performed, it takes long time to recover the damage layer in the surface part of the SOI layer. Heat treatment for a long time causes problems such that the SOI layer or the buried oxide layer is etched or the like.

Thus, a combination of the above-mentioned methods are performed in the present invention. Namely, first, the damage layer on the surface part where the damage is large is removed by sacrificial oxidation, and then the remaining damage of the damage layer in the bulk part where the damage is small is recovered by heat treatment in a reducing atmosphere, and surface roughness is improved. According to such a method, it is not necessary to perform mechanical machining such as polishing or the like, so that the damage layer can be removed and surface roughness can be improved with maintaining thickness uniformity of the SOI layer. Furthermore, since the time of heat treatment in a reducing atmosphere can be shorten, the SOI layer or the buried oxide layer can be prevented from being etched. Furthermore, OSFs generated by sacrificial oxidation can be removed by heat treatment in a reducing atmosphere that is performed later.

The embodiments of the present invention will be further described below in detail, referring to the drawings, but is not limited thereto.

FIG. 1A to J is a flowchart showing an example of fabrication steps of SOI-wafer fabricating process according to the hydrogen ion delamination method of the present invention.

The present invention will be hereunder explained mainly as for a method of fabricating SOI wafer wherein two silicon wafers are bonded. In step A of the hydrogen ion delamination method shown in FIG. 1A to J, two silicon mirror polished wafers, namely a base wafer 1 to be a substrate and a bond wafer 2 to be SOI layer which are suitable for device specifications, are prepared.

In step B, at least one of the wafers (the bond wafer 2 in this case) is subjected to thermal oxidation so as to form on the surface thereof an oxide film 3 having a thickness of about 0.1 μm to 2.0 μm.

In step C, hydrogen ions or rare gas ions (hydrogen ions in this case) is implanted into one surface of the bond wafer 2 on which oxide film is formed, in order to form a fine bubble layer (enclosed layer) 4 which extends in parallel to the surface at a position corresponding to the mean penetration depth of ion implantation.

In step D, the base wafer 1 is superposed on the hydrogen ion-implanted surface of the hydrogen ion-implanted bond wafer 2 via the oxide film, and they are brought in close contact with each other. When the surfaces of the two wafers are brought into contact with each other at ambient temperature in a clean atmosphere, the wafers adhere to each other without use of adhesive or the like.

In step E, there is performed a heat treatment for delamination in which a delamination wafer 5 is delaminated from an SOI wafer 6 (composed of the SOI layer 7, a buried oxide film 3, and a base wafer 1) while the enclosed layer 4 is used as a delaminating plane. Heat treatment is performed, for example, at a temperature of about 500° C. or higher in an inert gas atmosphere so as to cause crystal rearrangement and bubble cohesion, and thereby the delaminated wafer 5 is delaminated from the SOI wafer 6. The damage layer 8 remains on the SOI layer 7 on the surface of the SOI wafer just as it is delaminated.

The above mentioned steps are the same as the steps of a conventional hydrogen ion delamination method. The steps following thereto are, according to the present invention, performed in one of the two ways as described below.

In one way of them, a bonding heat treatment is performed in the step F after the delaminating step as performed in the conventional method. In this step, the SOI wafer 6 is subjected to heat treatment at high temperature as bonding heat treatment to achieve sufficient bonding strength, since the bonding strength imparted in the closely contacting step D and the delaminating heat treatment step E described above is not sufficient for the two wafers to be used without further treatment in a device process. Preferably, this heat treatment is performed in an inert gas atmosphere at 1000–1300° C. for 30 minutes to 2 hours.

According to the conventional method, a step of polishing such as touch polishing is then performed to remove a damage layer on a delaminating surface which is a surface of the SOI layer 7 and the surface roughness. However, according to the present invention, heat treatment in an oxidizing atmosphere is performed in step G to form an oxide film 13 on the SOI layer 7 and incorporate the damage layer 8 into the oxide film 13.

In the step H, the oxide film 13 formed on the SOI layer 7 is removed. The removal of the oxide film 13 can be performed, for example, by etching it with an aqueous solution containing HF. If etching with an aqueous solution containing HF is performed, only the oxide film 13 can be removed, so that the SOI wafer 6 from which the damage layer is removed by sacrificial oxidation can be obtained. Furthermore, such treatment of the wafer with HF has advantages of simplicity and low cost.

In the step I, heat treatment in a reducing atmosphere is performed to improve the residual damage layer 8 on the surface of the SOI layer 7 and surface roughness.

As described above, when heat treatment in a reducing atmosphere is performed after the sacrificial oxidation heat treatment, the damage layer 8 remaining on the surface of the SOI layer and surface roughness can be removed without degrading thickness uniformity. Furthermore, since all or a part of the damage layer 8 has already been removed by the sacrificial oxidation heat treatment in steps G and H, heat treatment in a reducing atmosphere can be performed efficiently in a short time. Accordingly, the SOI layer 7 and the buried oxide layer 3 can be prevented from being etched.

In the second way of the present invention, after delamination process, heat treatment in an oxidizing atmosphere in step G is performed without conducting an independent bonding heat treatment step F, and without polishing the surface of the SOI layer 7.

Namely, heat treatment in an oxidizing atmosphere is performed immediately after the delamination heat treatment (step G), and then the residual damage layer 8 on the surface of the SOI layer 7 and surface roughness are removed by removing the oxide film 13 (step H) and performing heat treatment in a reducing atmosphere (step I). In this case, bonding heat treatment (step F) can be performed between heat treatment in an oxidizing atmosphere (step G) and the removal of the oxide film 13 (step H). According to such a method, it is not necessary to polish the surface mechanically, so that thickness uniformity is not degraded. Furthermore, since the oxide film 13 can function also as a surface protecting film, during the bonding heat treatment the SOI layer 7 can be prevented from being etched in the case that the bonding heat treatment is performed in non-oxidizing atmosphere, so that the surface can be prevented from being roughened.

It is also possible to omit the bonding heat treatment (step F), and heat treatment in a reducing atmosphere (step I) can also function as the bonding heat treatment (step F). In that case, it is not necessary to perform a bonding heat treatment independently, and therefore a process can be more simple. As a result, productivity of high quality SOI wafers having can also be improved.

The SOI wafer 6 of high quality having the SOI layer 7 of high crystal quality and high thickness uniformity can be produced by the steps described above (step J).

Thickness of the oxide film 13 formed by heat treatment in an oxidizing atmosphere in the above-mentioned step G is preferably twice or more of the thickness of the damage layer 8 existing on the surface of the SOI layer 7 before the oxide film 13 is formed. This is because thermal oxidation of silicon is a penetrating type, and thus, when a thermal oxide film is formed on the surface of the silicon, the surface part of silicon is incorporated into the oxide film to the depth of about half of the thickness of the formed oxide film. Accordingly, if the oxide film 13 having a thickness of twice or more than the damage layer 8 is formed, all of the damage layer 8 can be incorporated into the oxide film 13, so that heat treatment in a reducing atmosphere to be performed later is lighten, and heat treatment time in reducing atmosphere can be short.

However, the present invention is not limited to the above manner. Depending on conditions such as thickness of the SOI layer 7, thickness of the buried oxide layer 3 or the like, thickness of the oxide film 13 to be formed can be changed as desired, so that a ratio of an amount of the damage layer 8 to be removed by sacrificial oxidation and an amount of the damage layer 8 to be removed by reducing heat treatment can be changed.

Oxidizing heat treatment in step G is preferably performed at a temperature lower than a temperature at which reducing heat treatment is performed later, and more preferably 1000° C. or less by the following reason.

As described above, OSFs generated during heat treatment in an oxidizing atmosphere can be removed by reducing heat treatment to be performed later, and OSFs can be removed easily when heat treatment in a reducing atmosphere is performed at higher temperature than oxidizing heat treatment is performed. Moreover, if an oxidizing heat treatment is performed at temperature of 1000° C. or lower, generation of OSFs itself can be prevented, and thus it is preferable to perform heat treatment at such a low temperature range.

In order to efficiently perform the above-mentioned heat treatment in a reducing atmosphere of step I, it is preferable to perform it through use of the rapid heating/rapid cooling apparatus at a temperature in the range of 1000 to 1300° C. for one to 60 seconds.

As described above, if the SOI wafer after sacrificial oxidation treatment is subjected to heat treatment in a reducing atmosphere through use of the rapid heating/rapid cooling apparatus, the damage layer 8 on the surface of the SOI wafer and surface roughness can be improved, efficiently in a quite short time. Moreover, since heat treatment in a reducing atmosphere can be performed efficiently in a short time, the SOI layer 7 and the buried oxide film 3 can be prevented more effectively from being etched.

Examples of an apparatus which can heat and cool a SOI wafer rapidly in a reducing atmosphere include: a heater such as a lamp heater with heat radiation. An example of commercially available apparatuses is SHS-2800 manufactured by AST corporation. These apparatuses are neither extremely complicated nor expensive.

Figure 3:
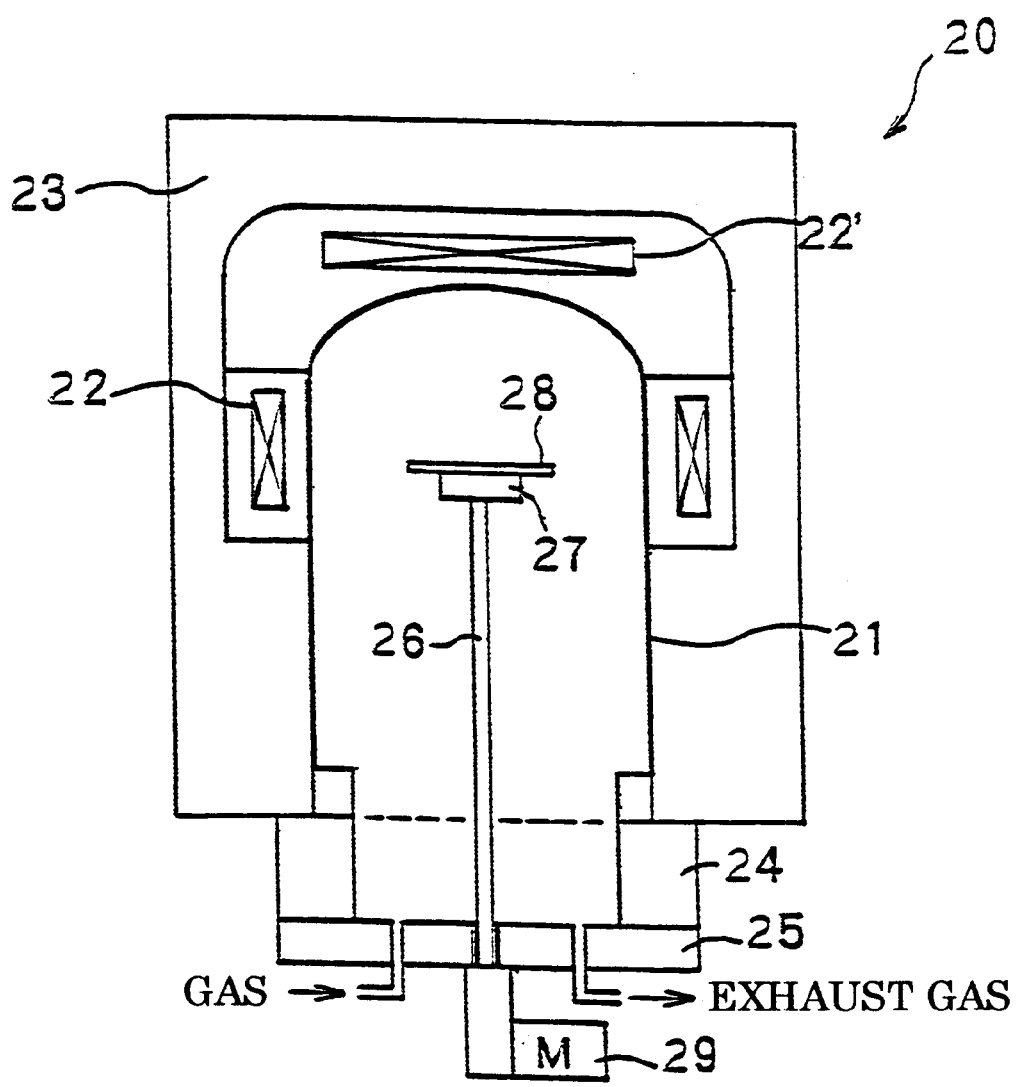
FIG. 3 is a schematic view of an example of a rapid heating/rapid cooling apparatus.

One example of the rapid heating/rapid cooling apparatus (RTA apparatus) for silicon single crystal wafer used in the present invention will be given below. FIG. 3 is a schematic view of the RTA apparatus.

A heat-treatment apparatus 20 shown in FIG. 3 includes a bell jar 21 which is formed from, for example, silicon carbide or quarts and in which a wafer is heat-treated. Heating is performed with heaters 22 and 22' surrounding the bell jar 21. The heaters are separated into the upper one and the lower one, so that power supplied to each of the heaters can be controlled independently. The heating method is not limited thereto, but so-called radiation heating and induction heating may also be applicable. A housing 23 for heat shield is disposed around the heaters 22 and 22'.

A water-cooled chamber 24 and a base plate 25 are arranged at the lower portion of the furnace so as to isolate the interior of the bell jar 21 from the atmosphere. A wafer 28 is held on a stage 27, which is attached to the top end of a support shaft 26, which, in turn, is moved vertically by means of a motor 29. In order to load a wafer into or unload from the furnace along a horizontal direction, the water-cooled chamber 24 has an unillustrated wafer port which is opened and closed by means of a gate valve. A gas inlet and a gas outlet are provided in the base plate 25 so that the gas atmosphere within the furnace can be adjusted.

In heat treatment apparatus 20 having the above-described structure, heat treatment with rapid heating/rapid cooling of a wafer is carried out in the procedure described below.

First, the interior of the bell jar 21 is heated to, for example, a desired temperature of 1000° C. to 1300° C. by the heaters 22 and 22' and is then held at the temperature. If the power supplied to the divided heaters is controlled separately from each other, a temperature distribution can be established within the bell jar 21 along a vertical direction. Accordingly, heat treatment temperature of a wafer can be determined by the position of the stage 27, i.e. the amount of insertion of the support shaft 26 into the furnace.

In a state in which the interior of the bell jar 21 is maintained at a desired temperature, a wafer is inserted into the water-cooled chamber 24 through the wafer port by an unillustrated wafer handling apparatus arranged next to heat treatment apparatus 20, and the inserted wafer is placed in, for example, a SiC boat provided on the stage 27 which is situated at the bottom standby position. Since the water-cooled chamber 24 and the base plate 25 are water-cooled, the wafer located at this position is not heated to a high temperature.

Upon completion of placing the SOI wafer on the stage 27, the motor 29 is immediately driven to insert the support shaft 26 into the furnace so that the stage 27 is raised to a heat treatment position where a desired temperature in the range of 1000° C. or more is established, and thereby the SOI wafer on the stage is subjected to heat treatment at high temperature. In this case, since only approximately 20 seconds, for example, is required for moving the stage 27 from the bottom position in the wafer-cooled chamber 24 to the desired heat treatment position, the SOI wafer is heated quickly.

The stage 27 is halted at the desired temperature position for a predetermined time (one second or more), and thereby the SOI wafer can be subjected to high-temperature heat treatment during the halting time. Upon elapse of the predetermined time to complete the high-temperature heat treatment, the motor 29 is immediately driven to withdraw the support shaft 26 from the interior of the furnace to thereby lower the stage 27 to the bottom standby position in the water-cooled chamber 24. This lowering motion can be completed in approximately 20 seconds, for example. The wafer on the stage 27 is quickly cooled, since the water-cooled chamber 24 and the base plate 25 are water-cooled. Finally, the wafer is unloaded by the wafer handling apparatus to complete heat treatment.

When there are more SOI wafers to be subjected to heat treatment, the wafers can be sequentially loaded into the furnace and subjected to heat treatment, since the temperature in heat treatment apparatus 20 is not lowered.

The atmosphere of heat treatment in a reducing atmosphere in the above-mentioned step I is preferably a 100% hydrogen atmosphere or a mixed atmosphere of hydrogen and argon.

In the above-mentioned atmosphere for heat treatment, a harmful film is not formed on the surface of the SOI wafer, and a damage layer on the surface of the SOI wafer and the surface roughness can be surely improved.

The present invention will be specifically explained hereunder by the following example and the comparative example. The example is not intended to limit the scope of the present invention.

EXAMPLE

Two mirror-polished silicon wafers having a diameter of 150 mm were prepared from a silicon single crystal ingot produced by Czochralski method, and having crystal orientation <100>, a resistivity of 20 Ω·cm and a conductive type of p. One of them was used as a bond wafer, and the other was used as a base wafer, to fabricate SOI wafers 6 in steps A to J shown in FIG. 1 according to the hydrogen ion delamination method of the present invention.

First, the bond wafer 2 was delaminated according to the steps A to E in FIG. 1 to provide an SOI wafer 6. The SOI layer 7 was formed to have a thickness of 400 nm. The buried oxide layer 3 was formed to have a thickness of 700 nm. The other major process conditions were as follows.
1) Conditions of hydrogen implantation: H$^+$ions, implantation energy of 125 keV, implantation dose of $8 \times 10^{16}$/cm$^2$;
2) Conditions of heat treatment for delamination: in a N$_2$ gas atmosphere, at 500° C. for 30 minutes.

The SOI wafer 6 having the SOI layer 7 with thickness of 400 nm can be thus obtained. The surface roughness of the surface (delaminated surface) of the SOI wafer 6 just delaminated as shown in FIG. 1E as measured by atomic force microscope method at 1 μm square was 7.5 nm on the average (RMS value: root mean square roughness).

The value is 10 times or more as large as that of the general mirror polished silicon wafer, and shows that local surface roughness on the surface of the SOI layer which is just delaminated is large.

Depth of a damage layer 8 on the delaminated surface of the SOI wafer 6 just delaminated as shown in FIG. 1E was determined as follows. The SOI wafers were subjected to etching with KOH aqueous solution at a different etching removal. The SOI wafers were then subjected to a four step Secco etching method disclosed in H. Gassel et al. (J. Electrochem. Soc., 140, pp 1713, 1993), and observed with a microscope to count a density of pits existing on the surface. The etching removal was 0, 50, 100, 150, 200, 250, 300 nm. The results of measurement are shown as a curved line A in FIG. 2.

Figure 2:
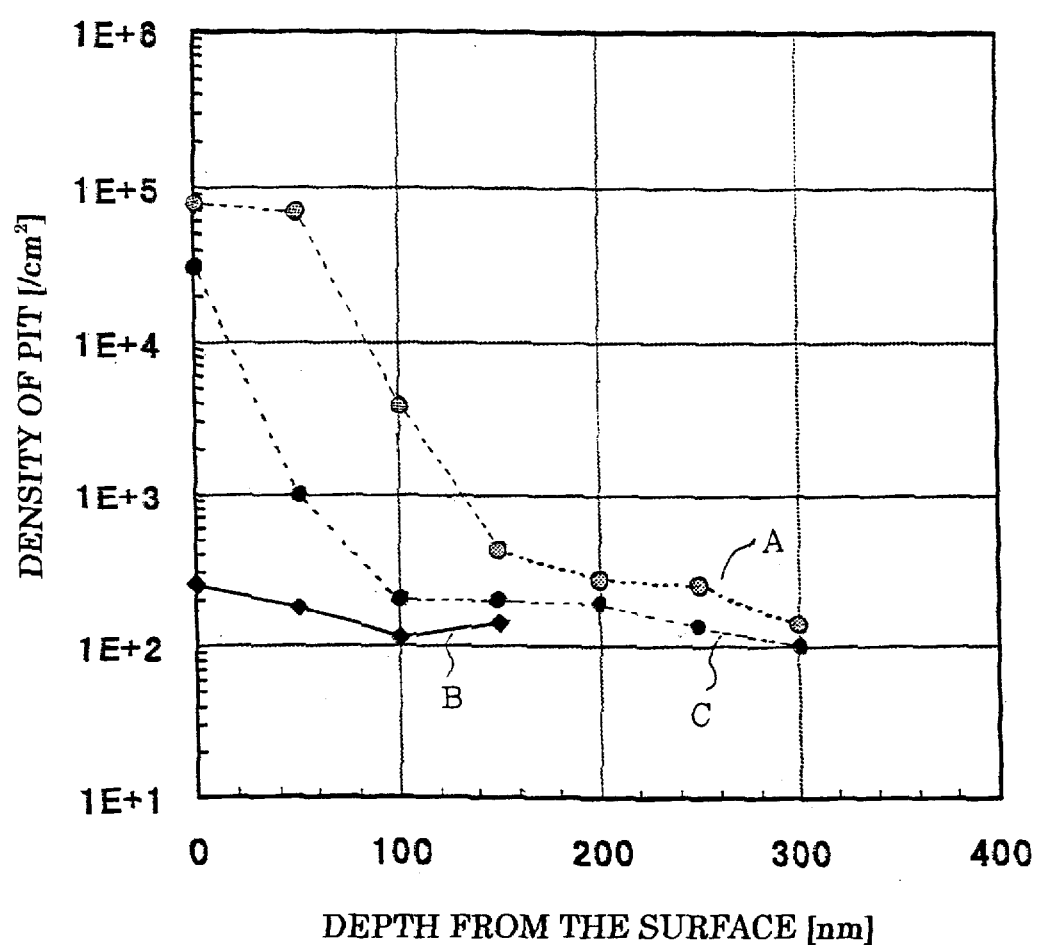
FIG. 2 is a graph showing a result of measurement of a damage layer of the SOI wafer after delamination.

As shown in FIG. 2, it is apparent that a damage layer having a depth of about 150 nm exists on the surface of the SOI wafer 6 just after delamination. Pits observed in a position deeper than 150 nm are likely crystal defects that have been originally present in the bond wafer.

Thickness of the SOI layer 7 of the SOI wafer 6 just delaminated in FIG. 1E was measured to determine thickness uniformity. Thickness was measured by reflective spectroscopy at several thousands points in 1 mm pitch on the surface area other than area within 10 mm from periphery of the SOI wafer 6. σ (a standard deviation) of the data was 0.9 nm, thickness uniformity (±3σ) was ±2.7 nm or less, and ±3 nm or less at the largest. Accordingly, it was found that thickness uniformity of the SOI layer 7 after delamination was quite excellent.

Next, the bonding heat treatment step of FIG. 1F is omitted, since a heat treatment in a reducing atmosphere of the step I to be performed later also functions as the bonding heat treatment. Then, as shown in FIG. 1G, without polishing, the SOI wafer 6 after bonding heat treatment was subjected to heat treatment in an oxygen atmosphere containing water vapor at 900° C. for 150 minutes to form the thermal oxide film having a thickness of about 340 nm on the surface of the SOI layer 7. The thickness of the oxide film is twice or more of the thickness of the damage layer 8, so that the damage layer 8 can be completely incorporated into the oxide film.

In FIG. 1H, the SOI wafer 6 having a thermal oxide film on their surface was dipped in 10% aqueous solution of hydrofluoric acid to remove the thermal oxide film on their surface completely.

In that case, the wafer was rinsed immediately after the etching treatment, and dried so that further roughness of the surface with etching treatment or the like can be prevented.

In FIG. 1I, the SOI wafer 6 after sacrificial oxidation heat treatment was subjected to heat treatment in a reducing atmosphere containing hydrogen, without being polished, through use of a rapid heating/rapid cooling apparatus shown in FIG. 3 under the following condition: in hydrogen 100% atmosphere, at 1225° C., for 45 seconds.

Before heat treatment, the SOI wafer 6 was subjected to cleaning for prevention of contamination thereof. The cleaning is well known as RCA cleaning, and comprises two steps: (ammonia/hydrogen peroxide) and (hydrochloric acid/hydrogen peroxide).

The surface roughness of the SOI layer 7 after heat treatment in a reducing atmosphere was 0.28 nm in average (RMS value) as measured by atomic force microscope method at 1 μm square. Accordingly, the surface roughness was significantly improved.

The value is equivalent to the surface roughness of the general mirror polished silicon wafer. Accordingly, it is apparent that the surface roughness was significantly improved by heat treatment in a reducing atmosphere.

Depth of the damage layer of the SOI wafer 6 was determined as follows. The SOI wafers were subjected to etching with KOH aqueous solution at a different etching removal. The SOI wafers were subjected to the above-described four step Secco etching method disclosed by H. Gassel et al., and observed with a microscope to count a density of pits existing on the surface. The etching removal was 0, 50, 100, 150 nm. The results of measurement were shown as a curved line B in FIG. 2.

As shown in the figure, it is apparent that the damage layer was eliminated from the surface of the SOI wafer after subjected to the sacrificial oxidation and heat treatment in a reducing atmosphere, though it was not polished. Namely, the surface defect density in the SOI layer 7 was about 200 number/cm$^2$ or less which was constant in depth. Accordingly, it was found that the damage layer was surely removed.

Thickness of the SOI layer of the SOI wafer was measured by reflective spectroscopy as described above to determine the thickness uniformity. σ of the data was 0.9 nm, and therefore, thickness uniformity (±3σ) was ±2.7 nm, which is the same value as that of the layer immediately after the delamination. Accordingly, it is apparent that the thickness uniformity of the SOI layer of the SOI wafer fabricated by the present invention is quite excellent.

Comparative Example

The SOI wafer 6 wherein the bond wafer 2 is delaminated was produced by the hydrogen ion delamination method in accordance with the steps A to E of FIG. 1 in the similar way to that of Example. In the comparative Example, the bonding heat treatment shown in FIG. 1F was omitted as described in Example, and the sacrificial oxidation treatment of steps G and H were not performed. Heat treatment in a reducing atmosphere of step I was performed under the same condition as Example through use of a rapid heating/rapid cooling apparatus.

The surface roughness of the SOI layer was measured by atomic force microscope method as described in Example. The state of the damage layer of the SOI wafers were determined by performing the above-mentioned four step Secco etching method, and observing it with a microscope to count a density of pits existing on the surface. The etching removal was 0, 50, 100, 150, 200, 250, 300 nm. The results were shown as a curved line C in FIG. 2. The thickness of the SOI layer was measured by reflective spectroscopy in a similar way to Example.

In the Comparative Example, the surface roughness of the SOI layer was 0.29 nm in average (RMS value). Accordingly, the surface roughness was improved. The thickness uniformity of the SOI layer was determined, and it was found that σ of the data of thickness uniformity of the SOI layer was 0.9 nm, thickness uniformity of the oxide film (±3σ) was ±2.7 nm, and thus thickness uniformity of the layer immediately after the delamination was maintained.

However, as shown in the curved line C in FIG. 2, the damage remained at the depth of about 50 nm from the surface. Accordingly, it was found that the damage layer was not removed completely. Since the damage layer has to be removed by polishing or the like, it is predicted that the thickness uniformity of the SOI layer will be degraded.

The present invention is not limited to the above-described embodiment. The above-described embodiment is a mere example, and those having the substantially same structure as that described in the appended claims and providing the similar action and effects are included in the scope of the present invention.

For example, the above description of the present invention has focused on the case that two silicon wafers are bonded to fabricate an SOI wafer. However, the present invention is not limited to the embodiment. For example, the present invention is applicable to the case that a silicon wafer is bonded to an insulator wafer after ion implantation; and a portion of the ion-implanted silicon wafer is delaminated to thereby provide an SOI wafer.

Furthermore, the process of fabricating the SOI wafer according to the present invention is not limited to that shown in FIG. 1. Other processes such as cleaning, heat treatment or the like can be added thereto. Furthermore, the order of the processes can be partly changed or omitted depending on the purpose.

What is claimed is:

1. A method of fabricating an SOI wafer by hydrogen ion delamination method wherein an oxide film is formed on an SOI layer by heat treatment in an oxidizing atmosphere after bonding heat treatment, then the oxide film is removed, and subsequently heat treatment in a reducing atmosphere is performed.

2. The method of fabricating an SOI wafer according to claim 1 wherein the above-mentioned heat treatment in a reducing atmosphere is performed at a temperature in the range from 1000° C. to 1300° C. for 1 to 60 seconds through use of a rapid heating/rapid cooling apparatus.

3. The method of fabricating an SOI wafer according to claim 2 wherein heat treatment in a reducing atmosphere is performed in 100% hydrogen atmosphere or a mixed atmosphere of hydrogen and argon.

4. The method of fabricating an SOI wafer according to claim 1 wherein heat treatment in a reducing atmosphere is performed in 100% hydrogen atmosphere or a mixed atmosphere of hydrogen and argon.

5. The method of fabricating an SOI wafer according to claim 1 wherein thickness of the oxide film formed on the SOI layer by the above-mentioned heat treatment in an oxidizing atmosphere is twice or more of thickness of the damage layer existing on the surface of the SOI layer before the oxide film is formed.

6. The method of fabricating an SOI wafer according to claim 1 wherein temperature for heat treatment in an oxidizing atmosphere is lower than temperature for heat treatment in a reducing atmosphere.

7. The method of fabricating an SOI wafer according to claim 1 wherein heat treatment in an oxidizing atmosphere is performed at a temperature of 1000° C. or lower.

8. An SOI wafer fabricated by the method according to claim 1.

9. A method of fabricating an SOI wafer by hydrogen ion delamination method wherein an oxide film is formed on an SOI layer by heat treatment in an oxidizing atmosphere after delaminating heat treatment, then the oxide film is removed, and subsequently heat treatment in a reducing atmosphere is performed.

10. The method of fabricating an SOI wafer according to claim 9 wherein the above-mentioned heat treatment in a reducing atmosphere is performed at a temperature in the range from 1000° C. to 1300° C. for 1 to 60 seconds through use of a rapid heating/rapid cooling apparatus.

11. The method of fabricating an SOI wafer according to claim 10 wherein heat treatment in a reducing atmosphere is performed in 100% hydrogen atmosphere or a mixed atmosphere of hydrogen and argon.

12. The method of fabricating an SOI wafer according to claim 9 wherein heat treatment in a reducing atmosphere is performed in 100% hydrogen atmosphere or a mixed atmosphere of hydrogen and argon.

13. The method of fabricating an SOI wafer according to claim 9 wherein thickness of the oxide film formed on the SOI layer by the above-mentioned heat treatment in an oxidizing atmosphere is twice or more of thickness of the damage layer existing on the surface of the SOI layer before the oxide film is formed.

14. The method of fabricating an SOI wafer according to claim 9 wherein temperature for heat treatment in an oxidizing atmosphere is lower than temperature for heat treatment in a reducing atmosphere.

15. The method of fabricating an SOI wafer according to claim 9 wherein heat treatment in an oxidizing atmosphere is performed at a temperature of 1000° C. or lower.

16. An SOI wafer fabricated by the method according to claim 9.

* * * * *